United States Patent [19]

Harada

[11] Patent Number: 4,837,790

[45] Date of Patent: Jun. 6, 1989

[54] MAXIMUM LENGTH LINEARLY OCCURRING CODE SEQUENCE GENERATOR

[75] Inventor: Masaaki Harada, Tokyo, Japan

[73] Assignee: Clarion, Co., Ltd., Tokyo, Japan

[21] Appl. No.: 109,432

[22] Filed: Oct. 16, 1987

[30] Foreign Application Priority Data

Oct. 24, 1986 [JP] Japan .................. 60-253993

[51] Int. Cl.$^4$ .................. G06M 3/02; H03K 19/21
[52] U.S. Cl. .................. 377/33; 377/80; 377/81; 307/443; 307/471
[58] Field of Search .................. 377/33, 115, 116, 77, 377/80, 81; 307/443, 471

[56] References Cited

U.S. PATENT DOCUMENTS

| | | | |
|---|---|---|---|
| 4,037,085 | 7/1977 | Minorikawa | 377/116 |
| 4,282,488 | 8/1981 | Norman et al. | 307/443 |
| 4,612,658 | 9/1986 | Eby | 307/471 |

FOREIGN PATENT DOCUMENTS 63-18835 1/1988 Japan .

Primary Examiner—John S. Heyman
Attorney, Agent, or Firm—Flynn, Thiel, Boutell & Tanis

[57] ABSTRACT

An m sequence generator according to this invention has a built-in flipflop circuit, whose input is the output of an exclusive OR gate for adding two m sequence inputs modulo 2 and which outputs a GOLD code synchronized with the rise or the fall of a clock signal and can generate selectively the m sequence or the GOLD code.

9 Claims, 9 Drawing Sheets

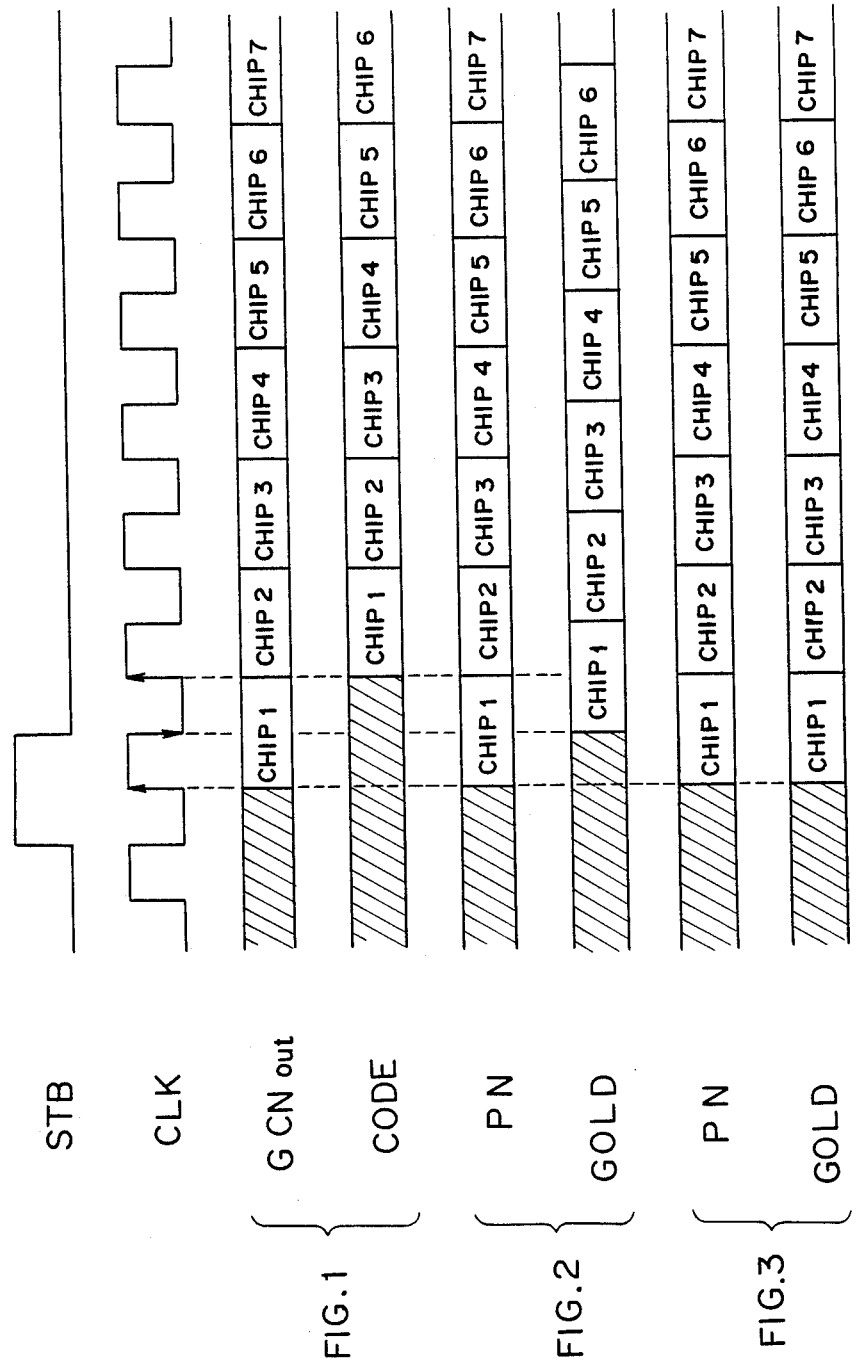

MAXIMUM LENGTH LINEARLY OCCURRING CODE SEQUENCE GENERATOR

FIELD OF THE INVENTION

This invention relates to a generator for generating maximum length linearly occurring code sequences (hereinbelow abbreviated to m sequences) of digital data.

BACKGROUND OF THE INVENTION

A GOLD code is formed by adding two m sequences PN 1 and PN 2, which are in synchronism with a clock signal CLK, modulo 2 by means of an exclusive logical sum (hereinbelow abbreviated to EOR) gate, as indicated in FIG. 8 (e.g., Japanese Application No. 61-163088, which corresponds to U.S. Ser. No. 070 491 filed July 7, 1987). In FIG. 8, PNG 1 and PNG 2 are m sequence generators and EOR indicates an exclusive logical sum gate.

As an m sequence generator in the form of an IC there is known a construction e.g. as indicated in FIG. 9. In FIG. 9 $G_1 \sim G_n$ are steering gates setting the initial value for shift registers and switching the operation of the shift registers; $SR_1 \sim SR_n$ are flipflops constituting the shift registers; $L_1 \sim L_6$ are latch circuits; MPX is a multiplexer; $AND_0 \sim AND_n$ are AND circuits; DEMPX is a demultiplexer; and $INV_1$, $INV_2$ are inverters. Further CLK represents a supplied clock signal; STB an m sequence generation initializing signal; CS a chip select signal; LE a latch enable signal; DAT $0 \sim n$ data; SEL $0 \sim 1$ data select signals; FB 0 a feedback input terminal; FB 1 an input terminal to the first stage steering gate; CAS an output for connecting the m sequence generators in cascade; FB 2 a three state output; PN a sequence output; and e,ovs/FBCNT/ a control input terminal of the multiplexer MPX having the three state output.

However there are known neither circuits stated above and indicated in FIG. 9 nor prior art m sequence generators having a built-in GOLD code generating circuit. Consequently, when a GOLD code was to be generated, it was necessary to connect an external circuit EX therewith, as indicated in FIG. 10. In FIG. 10 PNG 1 and PNG 2 are m sequence generators; EOR represents an exclusive logical sum gate; and D-FF represents a D-type flipflop. FIG. 11 shows waveforms in different parts of the circuit indicated in FIG. 10. Even if PNG 1 and PNG 2 are constructed by a same kind of ICs, since there are fluctuations in transmission delay time from the clock input CLK to the m sequence outputs PN 1 and PN 2, in the case where the output of the EOR gate is used as a GOLD code, the GOLD code is obtained usually by synchronizing PNG 1 and PNG 2 with a same clock, after the output of the EOR gate has been stabilized in a desired state.

For this reason, as indicated in FIG. 12, the GOLD code is outputted with a delay of 1 chip (1 period of clock) with respect to the m sequences PN 1 and PN 2. Such a phase delay of the GOLD code with respect to the n sequences as indicated in FIG. 10 was an inevitable problem, as far as the GOLD code was generated by an external circuit EX.

OBJECT OF THE INVENTION

The object of this invention is to provide an m sequence generator, in which a GOLD code generating circuit is built-in, permitting to generate easily the GOLD code without external circuit and to obtain the GOLD code having the same phase as the m sequences in synchronism with the clock signal.

SUMMARY OF THE INVENTION

In order to achieve the above object, an m sequence generator according to this invention, is provided with m sequence generating means comprising exclusive logical sum gates forming exclusive logical sums of two m sequences and flipflops removing hazards from the output thereof.

The signals inputted in the flipflops for removing the hazards described above are either the exclusive logical sum of an m sequence input from another device and the output of the first stage of the shift register of the m sequence generating means, and the clock signal, or the exclusive logical sum of the m sequence input from another device and the output of the first stage of the shift register of the m sequence generating means, and a phase inverted signal of the clock signal, or an exclusive logical sum of the m sequence input from another device and the input of the shift register described above, and the clock signal.

FIGS. 4 (a) and (b) show two basic constructions of the m sequence generator. In the figures $EOR_2 \sim EOR_n$ are exclusive logical sum gates; $SW_2 \sim SW_n$ are switches; and $D\text{-}FF_1 \sim D\text{-}FF_n$ are D type flipflops. Here all of them constitute the shift register. FIG. 4 (a) shows a construction, in which the output of each of the D type flipflops $D\text{-}FF_1 \sim D\text{-}FF_{n-1}$ is selected by the respective switch $SW_2 \sim SW_n$, operated by the respective $EOR_2 \sim EOR_n$ and the output of $EOR_2$ is fedback to the first stage $D\text{-}FF_1$ of the flipflops and FIG. 4 (b) shows a construction, in which the output of the last stage $D\text{-}FF_n$ is selected by each of the switches $SW_2 \sim SW_n$ and the output of each of the flipflops $D\text{-}FF_1 \sim D\text{-}FF_{n-1}$ is operated by $EOR_2 \sim EOR_n$. In general the former is called the simple construction type and the latter is called the modular type m sequence generator. Depending on which stage of the flipflops is selected as the output terminal of the m sequence, the phase of the m sequence obtained at the terminal varies, but the kind thereof is always same. However in the most cases the output of the first stage of the shift register is selected as the output terminal of the m sequence so that no inconveniences are produced, when the number of stages of the shift registers is changed.

The m sequence generator according to this invention is constructed so as to be indicated in FIG. 1 (a), FIG. 2 (a) and FIG. 3 (a). Those indicated there are circuits further developed, starting from the circuit indicated in FIGS. 4 (a) and (b). Here the construction, in which the m sequence is obtained from the output of the first stage of the shift register of a modular type m sequence generator, is taken as an example. However the same principle can be applied both to the simple construction type m sequence generator or to the case where the m sequence is outputted from any other stage of the shift register. In any case, the circuits consist of, apart from the shift register, exclusive logical sum gates $EOR_2 \sim EOR_n$ and D-type flipflops $D\text{-}FF_1 \sim D\text{-}FF_n$ removing hazards from the m sequence output and synchronizing the output with the clock signal. When the m sequence generators PNG 1 and PNG 2 indicated in FIGS. 1 (a), 2 (a) and 3 (a) are connected as indicated in FIGS. 1 (b), 2 (b) and 3 (b), respectively, it is possible to obtain easily the GOLD code.

BRIEF DESCRIPTION OF THE DRAWINGS

FIG. 5 is a timing chart for a GOLD code output;

FIG. 6 (b) is a block diagram illustrating the concrete construction of a steering gate according to this invention;

DETAILED DESCRIPTION

Figure 2A:
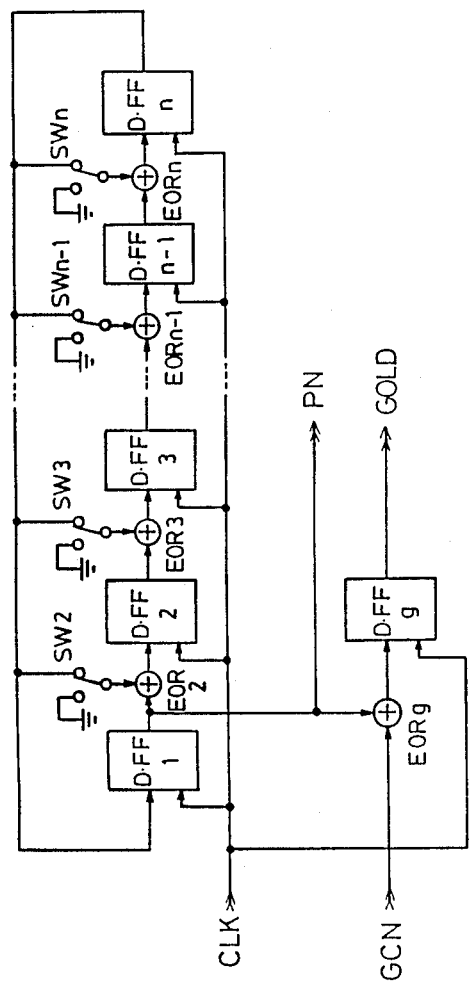
Figure 2B:
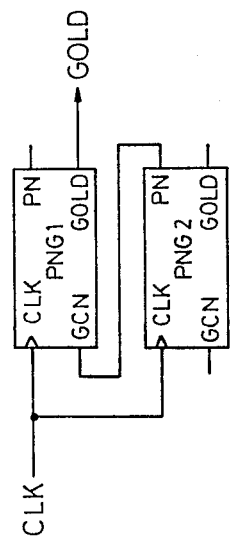
Figure 3A:
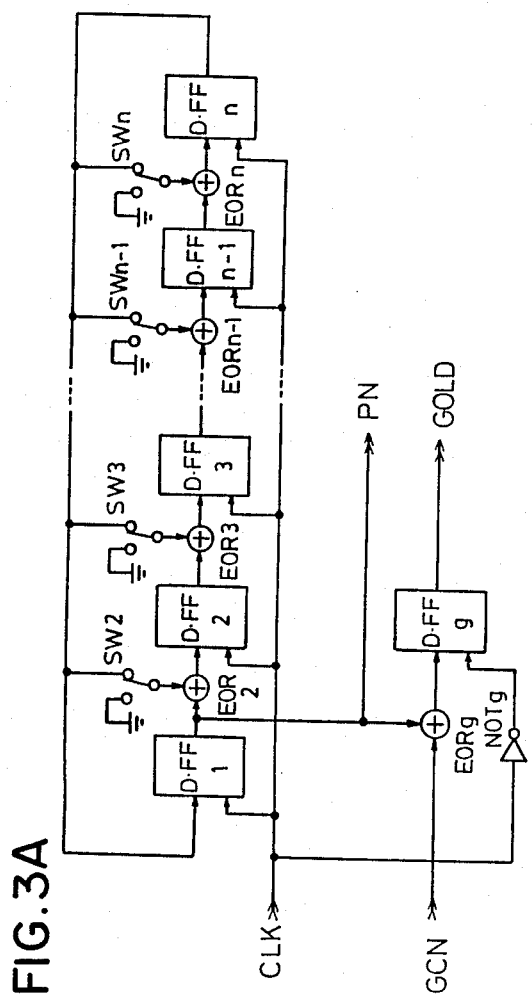
Figure 3B:
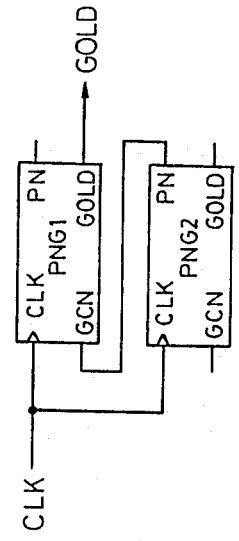
Figure 4A:
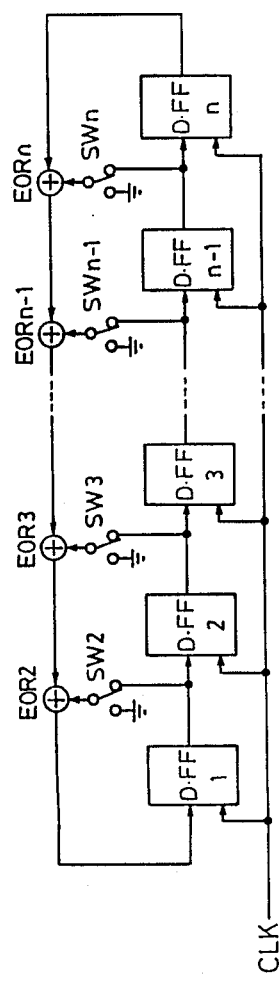
FIGS. 4 (a) and (b) are block diagrams illustrating the two basic constructions of the m sequence generator according to this invention.
Figure 4B:
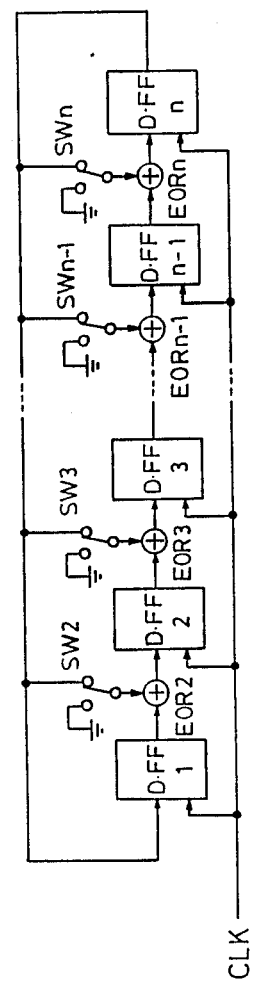

In FIGS. 2 (a) and (b) and FIGS. 3 (a) and (b) PN is an m sequence output terminal; GCN is an m sequence input terminal from another m sequence generator; and GOLD is a GOLD code output terminal. An input terminal of $EOR_g$ is connected with the output of a D type flipflop D-FF ($D\text{-}FF_1$) of the m sequence output stage of the shift register and the other input thereof is connected with the GCN terminal. The output thereof is connected with the D input of the $D\text{-}FF_g$. In FIGS. 2 (a) and (b) a clock signal, which is in phase with $D\text{-}FF_1 \sim D\text{-}FF_n$, and in FIGS. 3 (a) and (b) a clock signal, which is in opposite phase therewith, are inputted through the CLK terminal in the $D\text{-}FF_g$ and the GOLD code is outputted through the GOLD terminal in synchronism with the clock signal described above.

Figure 1A:
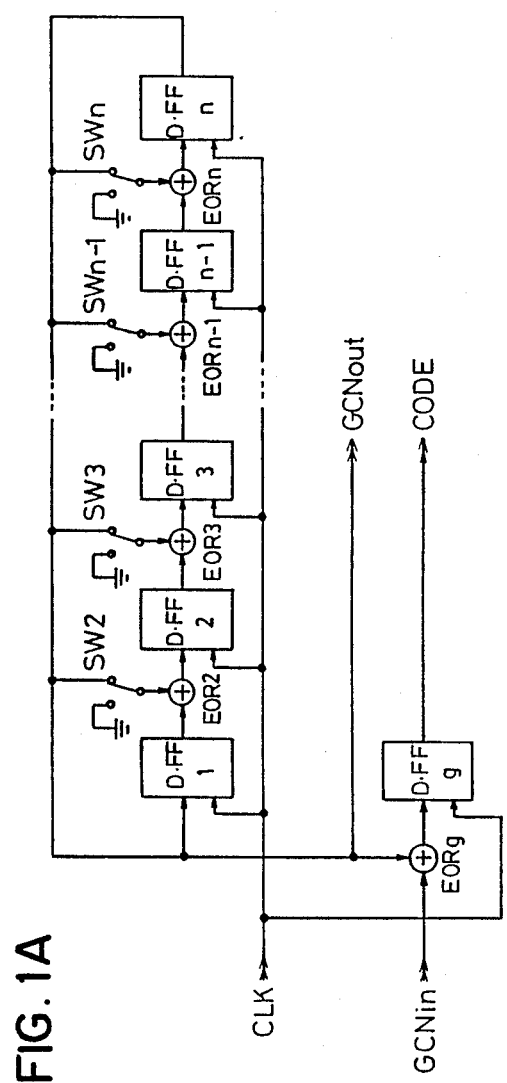
FIGS. 1 (a) and (b), FIGS. 2 (a) and (b) and FIGS. 3 (a) and (b) are block diagrams illustrating the construction of three different m sequence generators and their connections for generating a GOLD code, respectively, according to this invention.
Figure 1B:
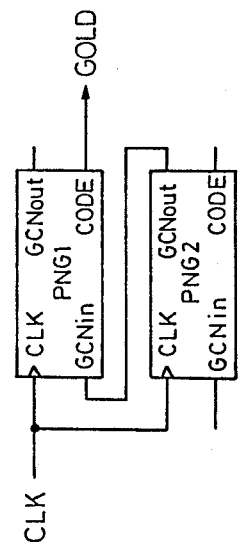

In FIGS. 1 (a) and (b) $GCN_{out}$ is an output terminal of an m sequence, whose phase is advanced by one chip phase, and $GCN_{in}$ is an input terminal of an m sequence, whose phase is advanced by one chip phase, coming from another m sequence generator. CODE is a GOLD code output terminal, in the case where an m sequence, whose phase is advanced by one chip phase, is inputted and an m sequence output terminal, in the case where $GCN_{in}$ is fixed at the low level. An input of $EOR_g$ is connected with the D-FF ($D\text{-}FF_1$) input of the m sequence output stage of the shift register and the other input thereof is connected with the $GCN_{in}$ terminal, while the output thereof is connected with the D input of the $D\text{-}FF_g$.

The device constructed as indicated in FIGS. 2 (a) and (b) is provided with a GOLD code generating section EX built-in therein, which delays the data output (m sequence) by 1 period of the clock signal by means of the $D\text{-}FF_g$, removes hazards from the output of the $EOR_g$ and outputs it. By this construction the GOLD code is outputted, delayed by one chip with respect to the m sequence.

In the device constructed as indicated in FIGS. 3 (a) and (b) an antiphase clock is inputted through an inverter $NOT_g$ in the $D\text{-}FF_g$, in order to improve further the m sequence generator in this view point. Since the $D\text{-}FF_g$ is triggered by the fall of the clock signal CLK, if the duty of the clock is 50%, the delay of the GOLD code generated in synchronism therewith with respect to the m sequence is reduced to ½ chip. However, since the tolerence time until the output of the $EOR_g$ gate is stabilized is reduced to a half, i.e. from 1 clock period to ½ clock period, the maximum clock frequency is reduced to ½ of that for the circuit indicated in FIGS. 2 (a) and (b).

The device constructed as indicated in FIGS. 1 (a) and (b) removes all these drawbacks. In the constructions indicated in FIGS. 2 (a) and (b) and FIGS. 3 (a) and (b), since the phase of the input signal is advanced by 1 clock with respect to that of the output signal, an m sequence, whose phase is advanced by 1 chip, is outputted to $GCN_{out}$. When two devices PNG 1 and PNG 2 of this construction are connected as indicated in FIG. 1 (b), an m sequence of another m sequence generator, whose phase is advanced by 1 chip, is inputted in the $GCN_{in}$ and in the $EOR_g$ two m sequences, whose phase is advanced by 1 chip, are added (exclusive logical sum) modulo 2 to each other. As the result the output of the $EOR_g$ is a GOLD code, whose phase is advanced by 1 chip, but owing to the following $D\text{-}FF_g$ a GOLD code, which is in synchronism with the clock signal and in phase with the m sequence, is obtained at the terminal CODE.

The device having the construction indicated in FIGS. 1 (a) and (b) has further another advantage that the terminal CODE, which is the GOLD code output terminal, can be at the same time the m sequence output terminal. In the case where the m sequence is outputted through the terminal CODE, it is sufficient to fix the terminal $GCN_{in}$ at the low level. For this reason it is possible to output alternatively the m sequence and the GOLD code through a same output terminal while changing over them. In this way it is possible to obtain special code outputs.

FIG. 5 shows timing of the m sequence and the GOLD code output of the m sequence generators indicated in FIGS. 1 (a) and (b), FIGS. 2 (a) and (b) and FIGS. 3 (a) and (b).

Figure 6A:
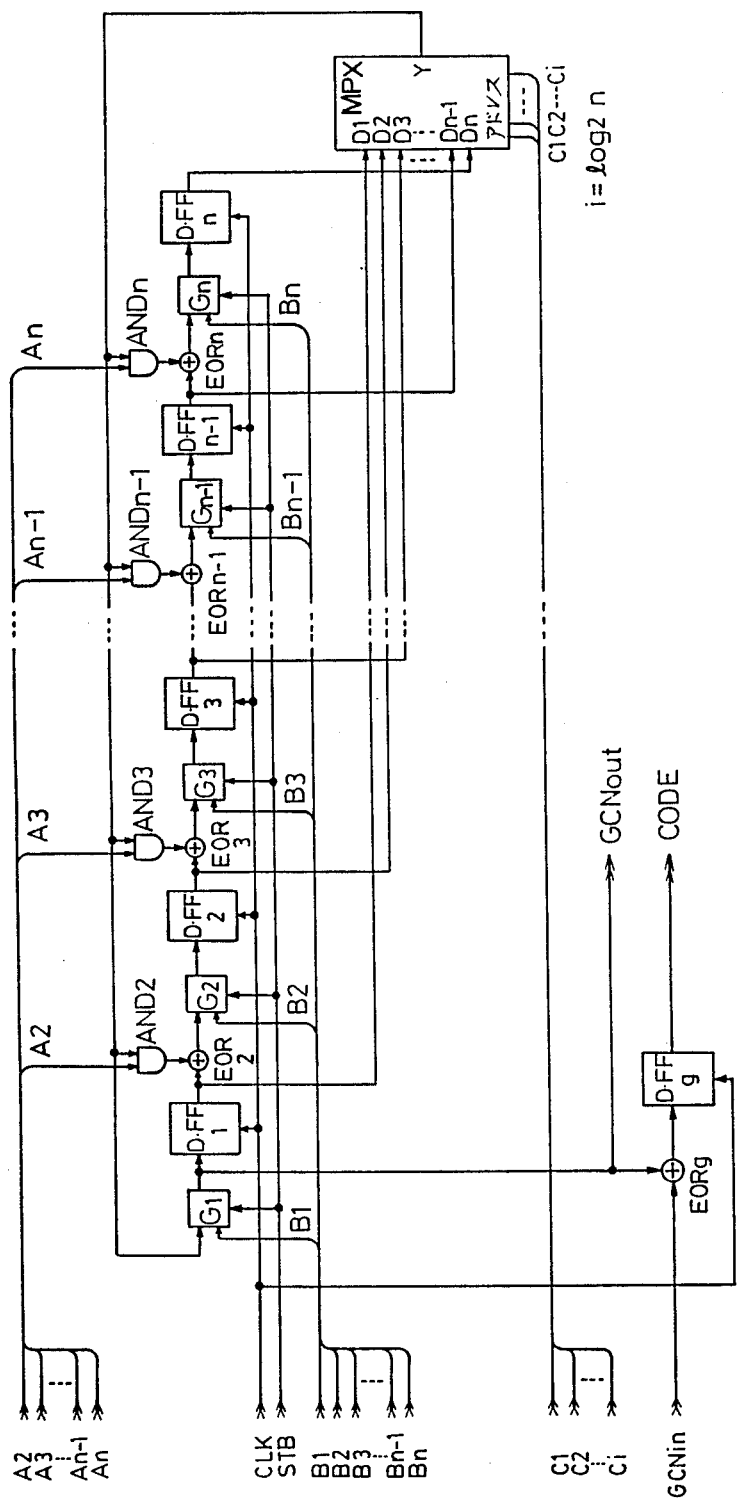
FIG. 6 (a) is a block diagram illustrating a concrete construction of the m sequence generator according to this invention.
Figure 6B:
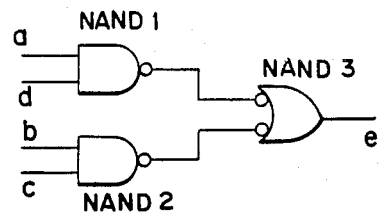

FIG. 6 (a) shows a concrete construction of the m sequence generator according to this invention based on the basic construction indicated in FIGS. 1 (a) and (b). The device indicated in the figure is of modular type. The code output thereof is taken out through the first stage (input of $D\text{-}FF_1$) of the shift register and the device has the basically same construction as that indicated in FIGS. 1 (a) and (b) except for the steering gates $G_1 \sim G_2$, the multiplexer MPX and the AND gate AND. By this device it is possible to set the feedback tap by means of the AND gates $AND_2 \sim AND_n$ (i.e. code sequence pattern), the initial value of the shift register by means of the steering gates $G_1 \sim G_n$ (i.e. code sequence phase) and the number of stages of the shift register (i.e. sequence length) so as to be able to output an arbitrary m sequence. In the figure A 2 ~ A n, B 1 ~ B n and C 1 ~ C i are data inputs for setting sequence patterns, sequence phases and sequence lengths, respectively, from the exterior. By obtaining the $GCN_{out}$ and the input to $EOR_g$ through the output of the steering gate $G_1$ it is possible to output exactly the GOLD code from the initial value (chip 1). The steering gate G may be constructed e.g. by using three NAND gate NAND$_1$~NAND$_3$, as indicated in FIG. 6 (b).

Figure 7:
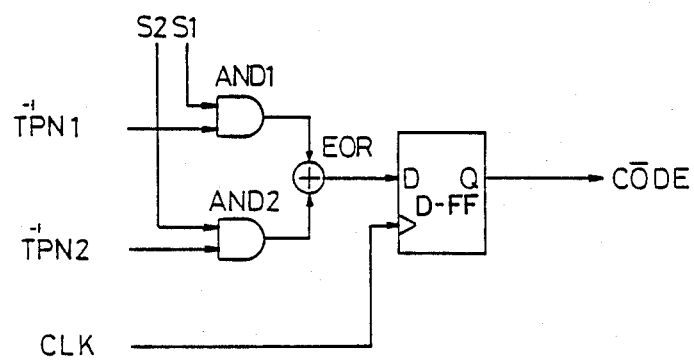
FIG. 7 is a block diagram of a circuit for switching over the output code.
Figure 8:
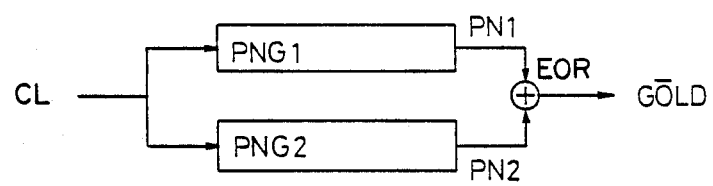
FIG. 8 is a scheme showing the principle of the generation of the GOLD code.
Figure 9:
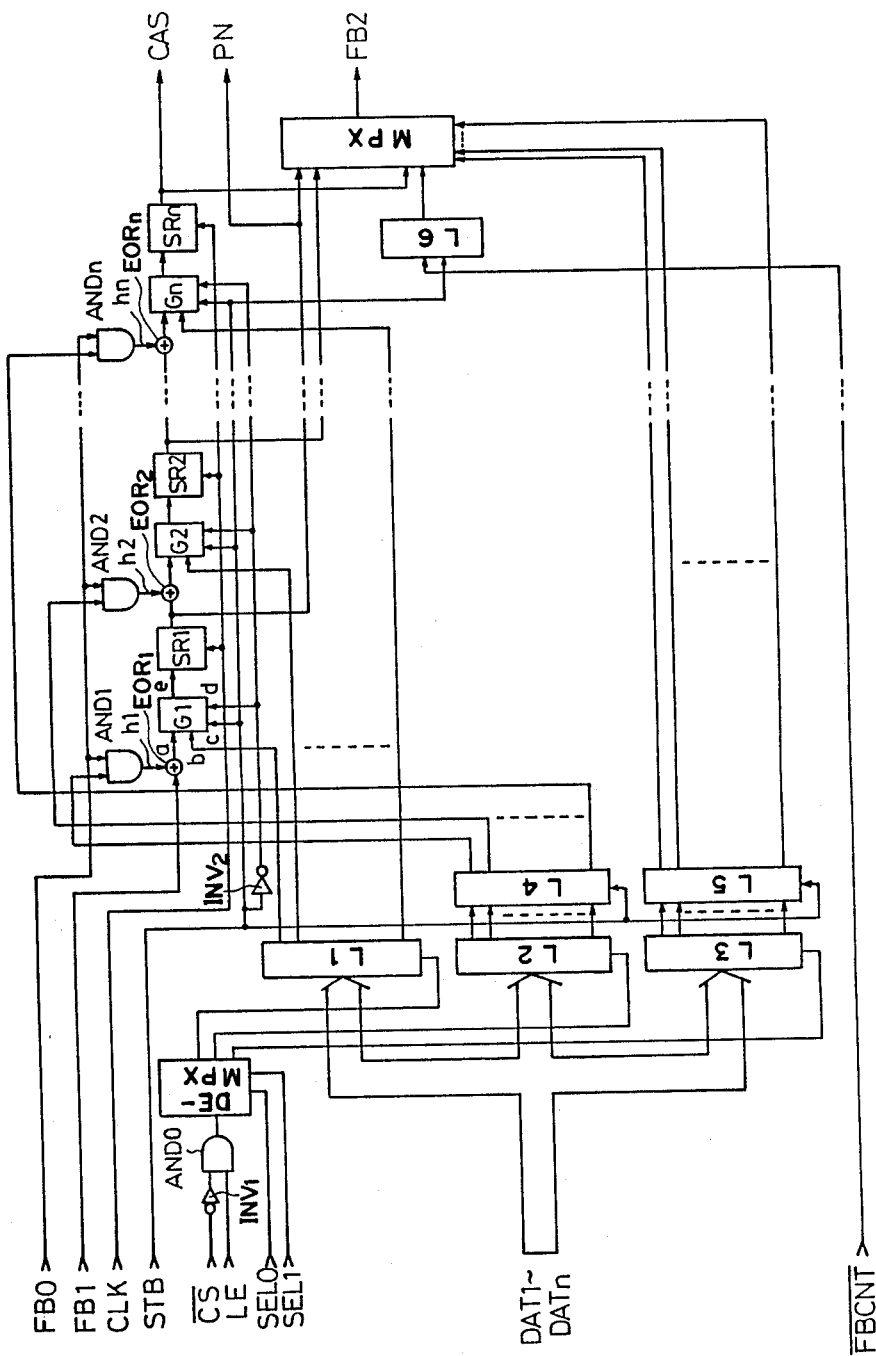
FIG. 9 is a block diagram illustrating the construction of a prior art m sequence generating IC.
Figure 10:
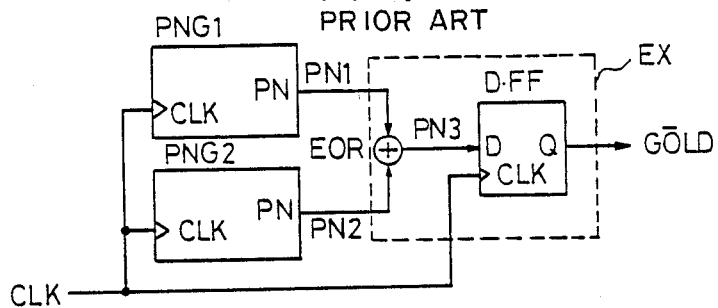
FIG. 10 is a block diagram illustrating the construction of a GOLD code generating circuit.
Figure 11:
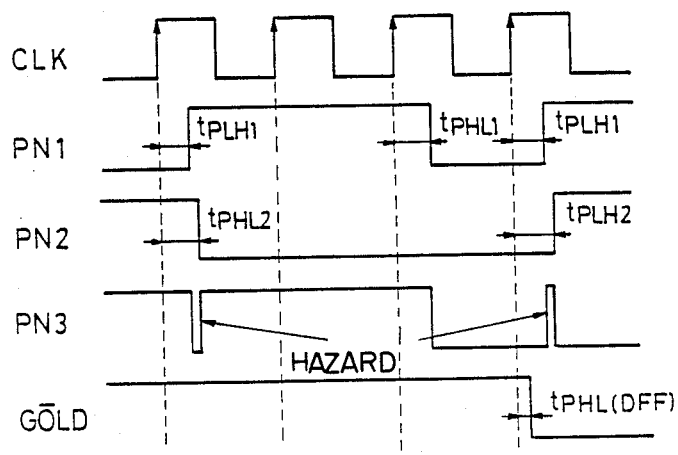
FIG. 11 is a scheme showing waveforms in different parts of the circuit indicated in FIG. 10.
Figure 12:
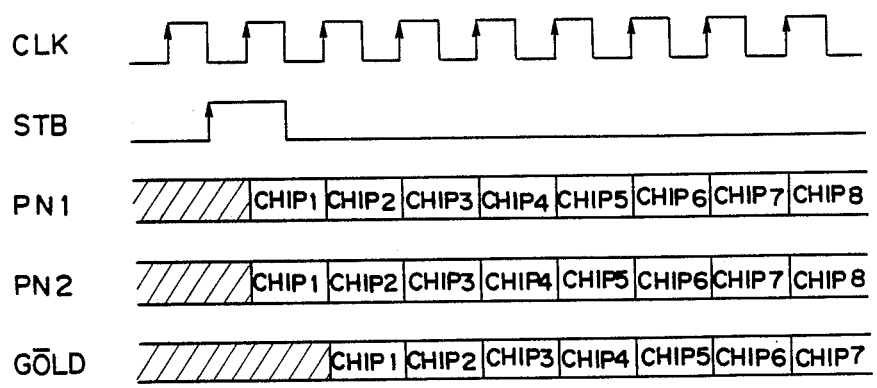
FIG. 12 is a timing chart for the GOLD code output obtained by the prior art circuit indicated in FIG. 10.

FIG. 7 is a block diagram illustrating the construction of an output code switching over circuit, in which T$^{-1}$PN 1 is an m sequence, whose phase is advanced by 1 chip, from the device PNG 1 described above and T$^{-1}$PN 2 is another kind of m sequences, whose phase is advanced by 1 chip, from another device PNG 2. Further S 1 and S 2 are signals for selecting the codes outputted through the terminal CODE and the codes indicated in TABLE 1 are set, depending on the value of S 1 and S 2.

TABLE 1

| | Setting of output code | |
|---|---|---|
| S 2 | S 1 | CODE |
| L | L | L |
| L | H | PN 1 (m sequence 1) |
| H | L | PN 2 (m sequence 2) |
| H | L | PN 1 ⊕ PN 2 (GOLD code) |

Since The terminal CODE serves both as the output terminal for 2 kinds of m sequences and as the output terminal for the GOLD code obtained based thereon, it is possible to change over continuously the code outputted through the terminal GOLD without any change of connection. Owing to this fact it is possible to generate special codes, in which the m sequences and the GOLD code are alternatively changed over.

As explained above, according to this invention, it is possible to generate easily the GOLD code without external circuit owing to the fact that a GOLD code generating circuit is built-in in the m sequence generator and further an advantage can be obtained that a GOLD code having the phase and timing completely identical to the m sequence output, which could not be realized heretofore without any external circuit.

While particular embodiments of the invention have been shown and described, it will be obvious to those skilled in the art that various changes and modifications may be made without departing from broader aspect.

The embodiments of the invention in which an exclusive property or privilege is claimed are defined as follows:

1. An m sequence generator for producing a GOLD code, comprising:
    first m sequence generator means for generating a first m sequence, including a plurality of first flip-flops each having a clock input driven by a clock signal and having a data input and a data output, and a gating circuit which is connected to said data input and said data output of each said first flip-flop, said first m sequence being present at said data input of one of said first flip-flops;
    second m sequence generator means for generating a second m sequence, including a plurality of second flip-flops each having a clock input driven by said clock signal and having a data input and a data output, and a gating circuit which is connected to said data input and said data output of each said second flip-flop, said second m sequence being present at said data input of one of said second flip-flops;
    an exclusive logic sum gate which has two inputs respectively coupled to said data input of said one first flip-flop and said data input of said one second flip-flop and which produces at an output thereof an exclusive logic sum of said first m sequence and said second m sequence; and
    a further flip-flop which has a data input connected to said output of said exclusive logic sum gate and a clock input driven by said clock signal, and which produces at a data output thereof a GOLD code.

2. An m sequence generator according to claim 1, wherein said one of said first flip-flops and said one of said second flip-flops are each a first stage flip-flop of said first and second generator means, respectively.

3. An m sequence generator for producing a GOLD code, comprising:
    first m sequence generator means for generating a first m sequence, including a plurality of first flip-flops each having a clock input driven by a first clock signal and having a data input and a data output, and a gating circuit which is connected to said data input and said data output of each said first flip-flop, said first m sequence being present at said data output of one of said first flip-flops;
    second m sequence generator means for generating a second m sequence, including a plurality of second flip-flops each having a clock input driven by said first clock signal and having a data input and a data output, and a gating circuit which is connected to said data input and said data output of each said second flip-flop, said second m sequence being present at said data output of one of said second flip-flops;
    an exclusive logic sum gate which has two inputs respectively coupled to said data outputs of said one first flip-flop and said one second flip-flop and which produces at an output thereof an exclusive logic sum of said first m sequence and said second m sequence;
    opposite-phase clock generating means responsive to said first clock signal for generating at an output thereof a second clock signal which is opposite in phase to said first clock signal; and
    a further flip-flop which has a data input connected to said output of said exclusive logic sum gate and a clock input driven by said second clock signal from said output of said opposite-phase clock generating means, and which produces at a data output thereof a GOLD code.

4. An m sequence generator according to claim 3, wherein said one of said first flip-flops and said one of said second flips-flops are each a first stage flip-flop of said first and second generator means, respectively.

5. A sequence generator apparatus for producing a GOLD code, comprising first and second sequence generator packages each having a clock input terminal, a sequence output terminal, a sequence input terminal and a code output terminal, each said sequence generator package including: generator means responsive to said clock input terminal for generating an m sequence at an output thereof which is connected to said sequence output terminal; an exclusive OR gate having first and second inputs and an output; first means for operatively coupling said first and second inputs of said exclusive OR gate respectively to said output of said generator means and to said sequence input terminal; a flip-flop having a clock input, a data input connected to said output of said exclusive OR gate, and a data output connected to said code output terminal; and second means for operatively connecting said clock input terminal to said clock input of said flip-flop; said clock input terminals of said first and second sequence generator packages being connected to each other and carrying a clock signal, and said sequence output terminal of said second sequence generator package being connected to said sequence input terminal of said first sequence generator package, wherein said first sequence generator package produces at said code output thereof a GOLD code.

6. An apparatus according to claim 5 wherein, in each said sequence generator package, said first means includes said first input of said exclusive OR gate being connected directly to said output of said generator means and includes said second input of said exclusive OR gate being connected directly to said sequence input terminal.

7. An apparatus according to claim 5, wherein each said sequence generator package includes first and second select terminals, and wherein said first means of each said sequence generator package includes first and second AND gates, said first AND gate having a first input connected to said first select terminal, a second input connected to said output of said generator means, and an output connected to said first input of said exclusive OR gate, and said second AND gate having a first input connected to said second select terminal, a second input connected to said sequence input terminal, and an output connected to said second input of said exclusive OR gate.

8. An apparatus according to claim 5, wherein said second means includes said clock input terminal being connected directly to said clock input of said flip-flop.

9. An apparatus according to claim 5, wherein said second means includes an invertor having an input connected to said clock input terminal and having an output connected to said clock input of said flip-flop.

* * * * *